US008278696B2

(12) United States Patent  
Ozawa et al.

(10) Patent No.: US 8,278,696 B2  
(45) Date of Patent: Oct. 2, 2012

(54) SEMICONDUCTOR DEVICE AND METHOD OF MANUFACTURING THE SAME

(75) Inventors: Yoshio Ozawa, Yokohama (JP); Ryota Fujitsuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 12/425,077

(22) Filed: Apr. 16, 2009

(65) Prior Publication Data

US 2009/0261400 A1 Oct. 22, 2009

(30) Foreign Application Priority Data

Apr. 17, 2008 (JP) ................................. 2008-108048

(51) Int. Cl.
*H01L 29/788* (2006.01)
(52) U.S. Cl. ..................... 257/314; 257/321; 257/E29.3; 257/E21.422; 257/E21.536
(58) Field of Classification Search .................. 257/314, 257/321; 438/587
See application file for complete search history.

(56) References Cited

U.S. PATENT DOCUMENTS

| | | | | |
|---|---|---|---|---|
| 6,489,649 | B2 * | 12/2002 | Kobayashi et al. | 257/314 |
| 6,772,992 | B1 * | 8/2004 | Lombardo et al. | 257/315 |
| 2003/0219989 | A1 * | 11/2003 | Terasaki et al. | 438/725 |
| 2005/0230766 | A1 * | 10/2005 | Nomoto et al. | 257/411 |
| 2005/0280069 | A1 * | 12/2005 | Mizushima et al. | 257/314 |
| 2006/0281331 | A1 * | 12/2006 | Wang | 438/778 |
| 2007/0228447 | A1 * | 10/2007 | Ozawa | 257/314 |
| 2007/0241389 | A1 * | 10/2007 | Ozawa et al. | 257/314 |
| 2008/0073704 | A1 * | 3/2008 | Yasuda | 257/324 |
| 2008/0157185 | A1 * | 7/2008 | Joo et al. | 257/324 |
| 2008/0272424 | A1 * | 11/2008 | Kim et al. | 257/321 |
| 2008/0296653 | A1 * | 12/2008 | Ozawa et al. | 257/316 |
| 2009/0032863 | A1 * | 2/2009 | Levy et al. | 257/324 |
| 2009/0294828 | A1 * | 12/2009 | Ozawa et al. | 257/319 |
| 2010/0019312 | A1 * | 1/2010 | Sekine et al. | 257/326 |
| 2010/0270609 | A1 * | 10/2010 | Olsen et al. | 257/324 |

FOREIGN PATENT DOCUMENTS

| | | |
|---|---|---|
| JP | 2002-190535 | 7/2002 |
| JP | 3436315 | 6/2003 |
| JP | 2004-158810 | 6/2004 |
| JP | 2007-184380 | 7/2007 |

OTHER PUBLICATIONS

Ozawa; "Semiconductor Memory Device and Method for Fabricating the Same", U.S. Appl. No. 12/354,898, filed Jan. 16, 2009.

* cited by examiner

*Primary Examiner* — A. Sefer
(74) *Attorney, Agent, or Firm* — Finnegan, Henderson, Farabow, Garrett & Dunner, L.L.P.

(57) ABSTRACT

A semiconductor device includes a tunnel insulating film formed on a semiconductor substrate, a charge storage insulating film formed on the tunnel insulating film and including at least two separated low oxygen concentration portions and a high oxygen concentration portion positioned between the adjacent low oxygen concentration portions and having a higher oxygen concentration than the low oxygen concentration portions, a charge block insulating film formed on the charge storage insulating film, and control gate electrodes formed on the charge block insulating film and above the low oxygen concentration portions.

5 Claims, 6 Drawing Sheets

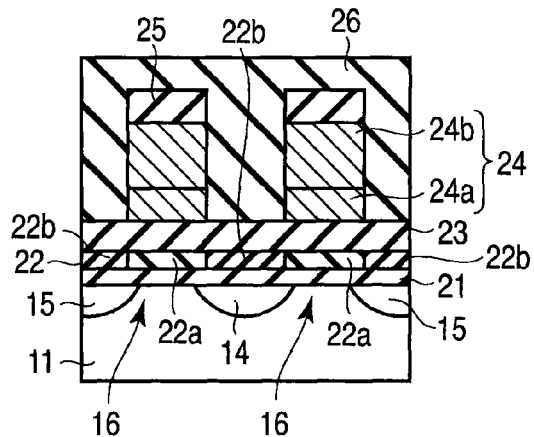 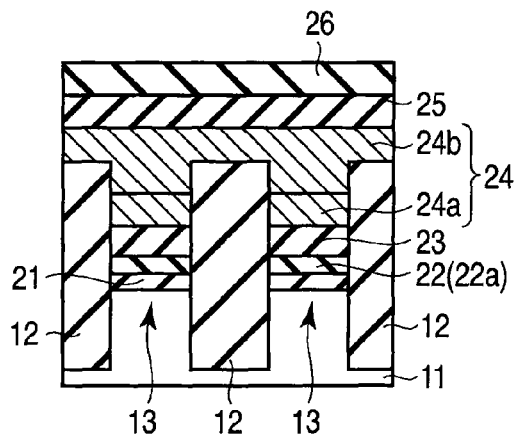
FIG. 1A     FIG. 1B
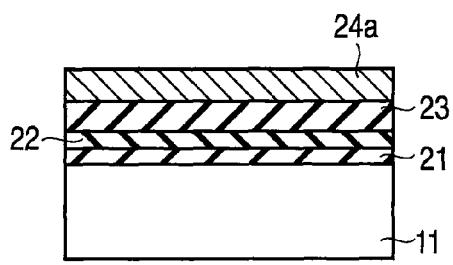 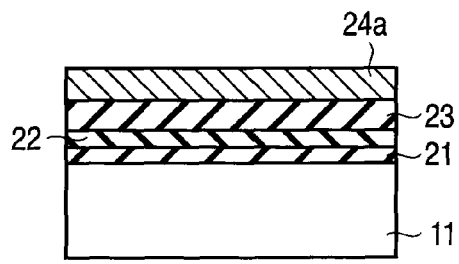
FIG. 2A     FIG. 2B
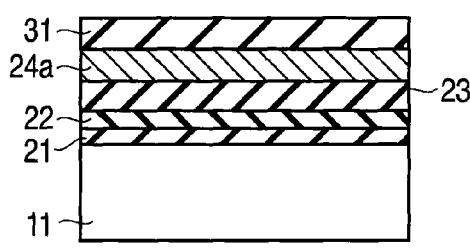 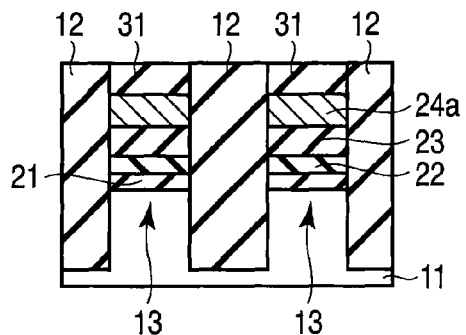
FIG. 3A     FIG. 3B

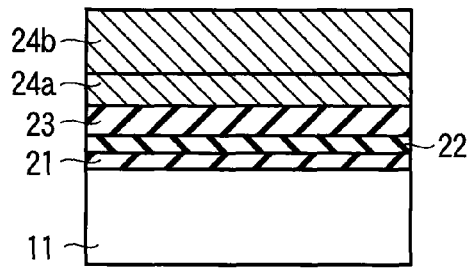
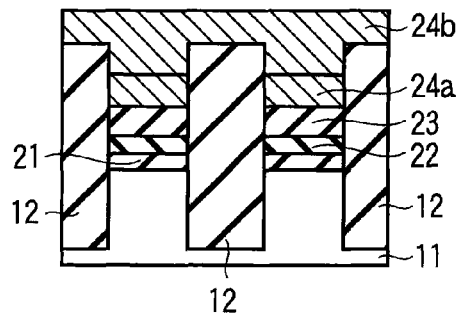
F I G. 4A              F I G. 4B
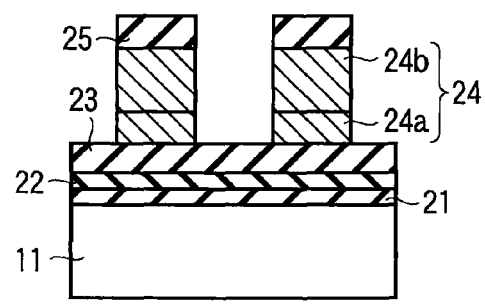
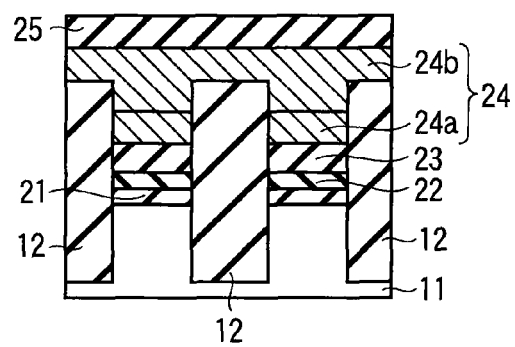
F I G. 5A              F I G. 5B
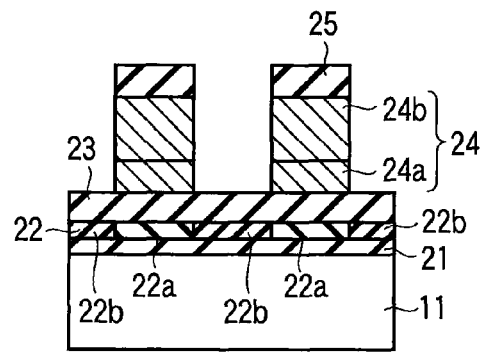
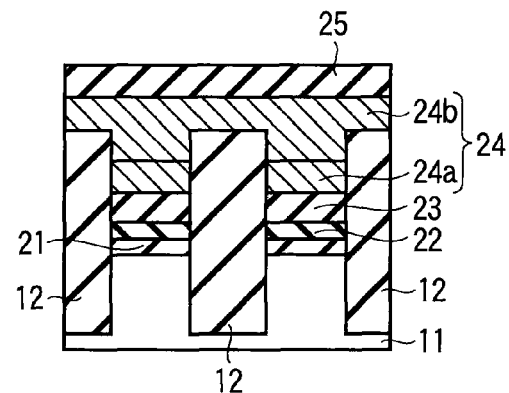
F I G. 6A              F I G. 6B

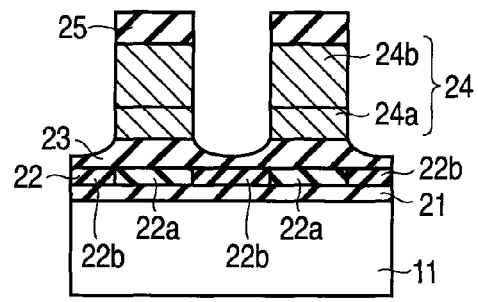
F I G. 13
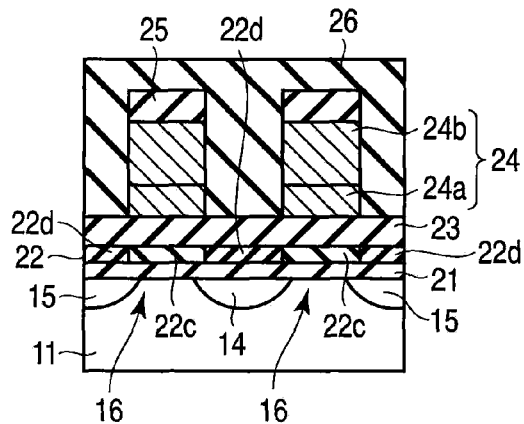 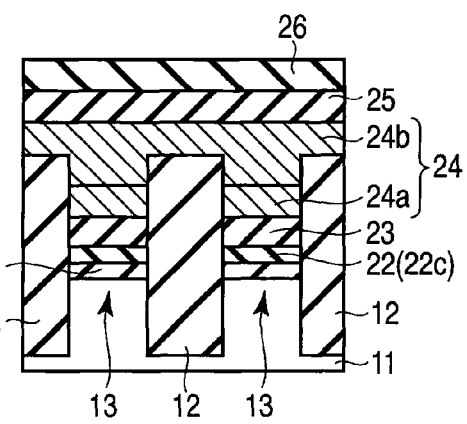
F I G. 14A    F I G. 14B
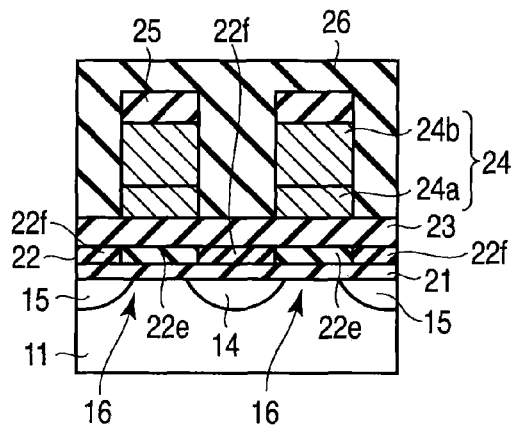 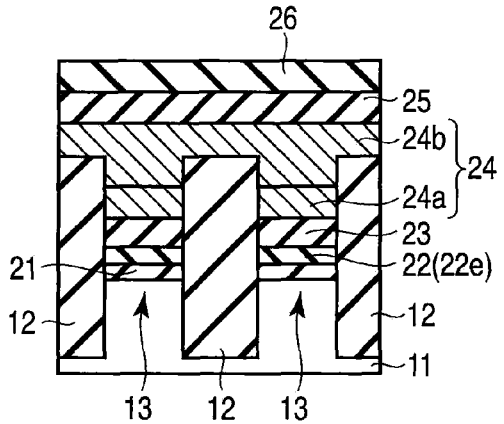
F I G. 15A    F I G. 15B

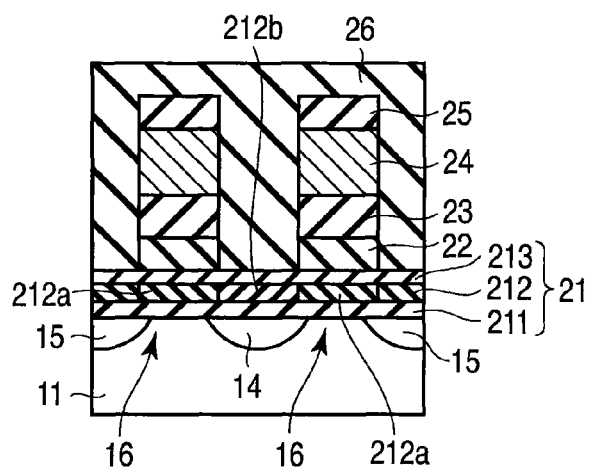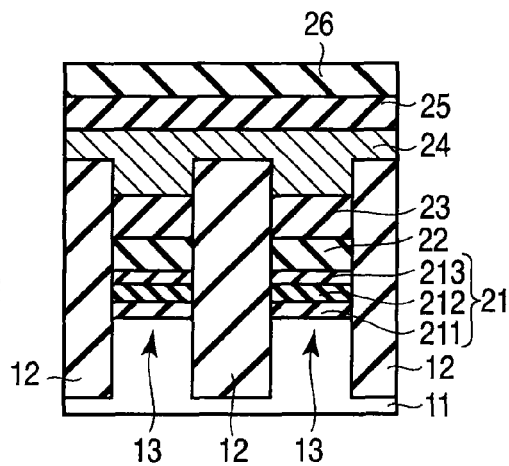
FIG. 16A    FIG. 16B
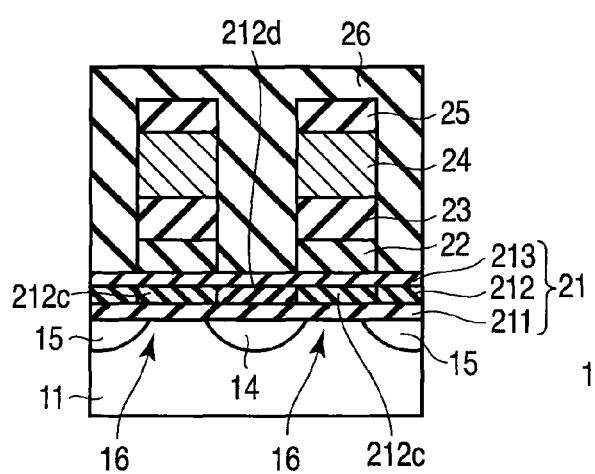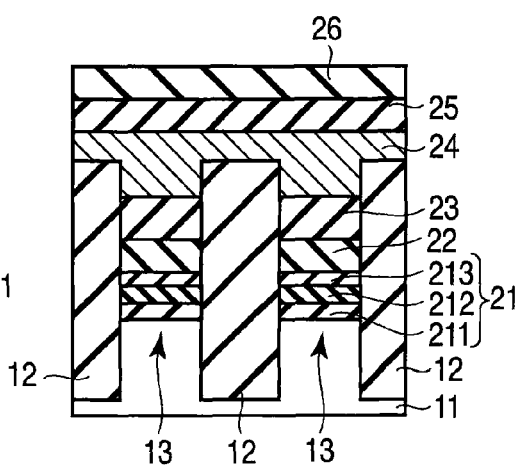
FIG. 17A    FIG. 17B

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2008-108048, filed Apr. 17, 2008, the entire contents of which are incorporated herein by reference.

BACKGROUND OF THE INVENTION

1. Field of the Invention

The present invention relates to a semiconductor device and a method of manufacturing the semiconductor device.

2. Description of the Related Art

A charge trap type nonvolatile semiconductor memory has been proposed which uses a charge storage insulating film for charge trapping as a charge storage layer (see Jpn. Pat. Appln. KOKAI Publication No. 2004-158810). In the charge trap type nonvolatile semiconductor memory, charges injected into the charge storage insulating film through a tunnel insulating film are trapped in trap states in the charge storage insulating film. The charges are thus stored in the charge storage insulating film. A typical charge trap type nonvolatile semiconductor memory is of a MONOS or SONOS type. A silicon nitride film or the like is used as a material for the charge storage insulating film.

In the charge trap type nonvolatile semiconductor memory, the charge storage insulating film is normally formed in the area between adjacent memory cells in a bit line direction. The charge storage insulating film has a high charge trap state density. Thus, a decrease in the distance between the adjacent memory cells may disadvantageously cause the charges stored in the charge storage insulating film to migrate between the adjacent memory cells. As a result, the operation characteristics and reliability of the semiconductor device may disadvantageously be degraded.

Another charge trap type nonvolatile semiconductor memory has been proposed which uses a tunnel insulating film with an ONO (silicon oxide film/silicon nitride film/silicon oxide film) structure (see Jpn. Pat. Appln. KOKAI Publication No. 2007-184380). However, because of the high charge trap state density of the silicon nitride film, a decrease in the distance between adjacent memory cells may disadvantageously cause charges trapped in the silicon nitride film to migrate between the adjacent memory cells. As a result, the operation characteristics and reliability of the semiconductor device may disadvantageously be degraded. These problems may commonly occur when a tunnel insulating film of a stack structure is used in which an insulating film with a high charge trap state density is provided between insulating films with a low charge trap state density.

Thus, in the conventional art, the migration of charges between the adjacent cells may disadvantageously degrade the operation characteristics and reliability of the semiconductor device.

BRIEF SUMMARY OF THE INVENTION

According to a first aspect of the present invention, there is provided a semiconductor device comprising: a tunnel insulating film formed on a semiconductor substrate; a charge storage insulating film formed on the tunnel insulating film and including at least two separated low oxygen concentration portions and a high oxygen concentration portion positioned between the adjacent low oxygen concentration portions and having a higher oxygen concentration than the low oxygen concentration portions; a charge block insulating film formed on the charge storage insulating film; and control gate electrodes formed on the charge block insulating film and above the low oxygen concentration portions.

According to a second aspect of the present invention, there is provided a semiconductor device comprising: a tunnel insulating film formed on a semiconductor substrate; a charge storage insulating film formed on the tunnel insulating film and including at least two separated low fluorine concentration portions and a high fluorine concentration portion positioned between the adjacent low fluorine concentration portions and having a higher fluorine concentration than the low fluorine concentration portions; a charge block insulating film formed on the charge storage insulating film; and control gate electrodes formed on the charge block insulating film and above the low fluorine concentration portions.

According to a third aspect of the present invention, there is provided a semiconductor device comprising: a tunnel insulating film formed on a semiconductor substrate and including a lower insulating film, an upper insulating film, and an intermediate insulating film between the lower insulating film and the upper insulating film, the intermediate insulating film including at least two separated low oxygen concentration portions and a high oxygen concentration portion positioned between the adjacent low oxygen concentration portions and having a higher oxygen concentration than the low oxygen concentration portions; a charge storage insulating film formed on the tunnel insulating film; a charge block insulating film formed on the charge storage insulating film; and control gate electrodes formed on the charge block insulating film and above the low oxygen concentration portions.

According to a fourth aspect of the present invention, there is provided a semiconductor device comprising: a tunnel insulating film formed on a semiconductor substrate and including a lower insulating film, an upper insulating film, and an intermediate insulating film between the lower insulating film and the upper insulating film, the intermediate insulating film including at least two separated low fluorine concentration portions and a high fluorine concentration portion positioned between the adjacent low fluorine concentration portions and having a higher fluorine concentration than the low fluorine concentration portions; a charge storage insulating film formed on the tunnel insulating film; a charge block insulating film formed on the charge storage insulating film; and control gate electrodes formed on the charge block insulating film and above the low fluorine concentration portions.

According to a fifth aspect of the present invention, there is provided a method of manufacturing a semiconductor device, comprising: forming a tunnel insulating film on a semiconductor substrate; forming a charge storage insulating film on the tunnel insulating film; forming a charge block insulating film on the charge storage insulating film; forming at least two separated control gate electrodes on the charge block insulating film; and introducing an oxygen radical or a fluorine radical from an area between the adjacent control gate electrodes through the charge block insulating film into the charge storage insulating film.

According to a sixth aspect of the present invention, there is provided a method of manufacturing a semiconductor device, comprising: forming a tunnel insulating film on a semiconductor substrate; forming a charge storage insulating film on the tunnel insulating film; forming a charge block insulating film on the charge storage insulating film; forming at least two separated control gate electrodes on the charge block insulating film; and introducing an oxidizing agent from an area between the adjacent control gate electrodes through the charge block insulating film into the charge storage insulating film, wherein before introducing the oxidizing agent into the charge storage insulating film, boron is introduced into at least that part of the charge storage insulating film into which the oxidizing agent is introduced.

According to a seventh aspect of the present invention, there is provided a method of manufacturing a semiconductor device, comprising: forming, on a semiconductor substrate, a tunnel insulating film including a lower insulating film, an upper insulating film, and an intermediate insulating film between the lower insulating film and the upper insulating film; forming a charge storage insulating film on the tunnel insulating film; forming a charge block insulating film on the charge storage insulating film; forming at least two separated control gate electrodes on the charge block insulating film; and introducing an oxygen radical or a fluorine radical from an area between the adjacent control gate electrodes into the intermediate insulating film.

BRIEF DESCRIPTION OF THE SEVERAL VIEWS OF THE DRAWING

FIGS. 1A and 1B are sectional views schematically showing the configuration of a semiconductor device according to a first embodiment of the present invention;

FIGS. 2A and 2B are sectional views schematically showing a part of a process of manufacturing a semiconductor device according to the first embodiment of the present invention;

FIGS. 3A and 3B are sectional views schematically showing a part of the process of manufacturing the semiconductor device according to the first embodiment of the present invention;

FIGS. 4A and 4B are sectional views schematically showing a part of the process of manufacturing the semiconductor device according to the first embodiment of the present invention;

FIGS. 5A and 5B are sectional views schematically showing a part of the process of manufacturing the semiconductor device according to the first embodiment of the present invention;

FIGS. 6A and 6B are sectional views schematically showing a part of the process of manufacturing the semiconductor device according to the first embodiment of the present invention;

FIG. 13 is a sectional view schematically showing a part of the process of manufacturing the semiconductor device according to the modification of the first embodiment of the present invention;

FIGS. 14A and 14B are sectional views schematically showing the configuration of a semiconductor device according to a second embodiment of the present invention;

FIGS. 15A and 15B are sectional views schematically showing the configuration of a semiconductor device according to a third embodiment of the present invention;

FIGS. 16A and 16B are sectional views schematically showing the configuration of a semiconductor device according to a fourth embodiment of the present invention; and FIGS. 17A and 17B are sectional views schematically showing the configuration of a semiconductor device according to a fifth embodiment of the present invention.

DETAILED DESCRIPTION OF THE INVENTION

Figure 7:
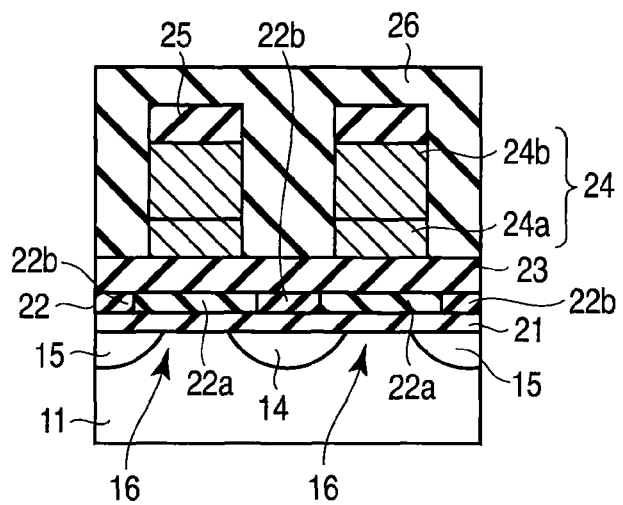
FIG. 7 is a sectional view schematically showing the configuration of a semiconductor device according to a modification of the first embodiment of the present invention.

Embodiments of the present invention will be described below with reference to the drawings. In the embodiments below, charge trap type NAND nonvolatile semiconductor memories will be described which use a charge trapping charge storage insulating film as a charge storage layer.

Embodiment 1

FIGS. 1A and 1B are sectional views schematically showing the configuration of a semiconductor device according to a first embodiment of the present invention. FIG. 1A is a sectional view taken along a channel length direction (bit line direction). FIG. 1B is a sectional view taken along a channel width direction (word line direction).

An element area (active area) 13 sandwiched between isolation areas (isolation insulating films) 12 is provided in a semiconductor substrate (silicon substrate) 11. The element area 13 has a source area 14, a drain area 15, and a channel area 16 between the source area 14 and the drain area 15.

A tunnel insulating film 21 made of a silicon oxide film is formed on the element area 13. A charge storage insulating film 22 containing silicon nitride as a main component is formed on the tunnel insulating film 21. The charge storage insulating film 22 includes at least two separated low oxygen concentration portions 22*a* and a high oxygen concentration portion 22*b* positioned between the adjacent low oxygen concentration portions 22*a*. The high oxygen concentration portion 22*b* has a higher oxygen concentration than the low oxygen concentration portions 22*b*. In the present embodiment, each of the low oxygen concentration portions 22*a* contains silicon and nitrogen as main components. The high oxygen concentration portion 22*b* contains silicon, nitrogen, and oxygen as main components. Specifically, the low oxygen concentration portion 22*a* is a silicon nitride film containing almost no oxygen. The high oxygen concentration portion 22*b* is a silicon oxynitride film. Thus, the trap state density of the high oxygen concentration portion 22*b* is lower than that of the low oxygen concentration portion 22*a*.

A charge block insulating film 23 is formed on the low and high oxygen concentration portions 22*a* and 22*b* of the charge storage insulating film 22. In the present embodiment, a lanthanum aluminate film is used as the charge block insulating film 23. A control gate electrode 24 is formed on the charge block insulating film 23 and above the low oxygen concentration portion 22*a* of the charge storage insulating film. The control gate electrode 24 serves as a word line. The control gate electrode 24 is composed of a lower control gate electrode film 24*a* formed of a doped polycrystalline silicon film and an upper control gate electrode film 24b formed of a tungsten silicide film. A mask film 25 is formed on the control gate electrode 24. The above-described charge block insulating film 23, control gate electrode 24, and mask film 25 are covered with an interlayer insulating film 26.

In the above-described charge trap type nonvolatile semiconductor memory cell, appropriate voltages are applied to between the control gate electrode 24 and the semiconductor substrate 11 to perform charging and discharging between the semiconductor substrate 11 and the charge storage insulating film 22 via the tunnel insulating film 21. Specifically, charges injected into the charge storage insulating film 22 through the tunnel insulating film 21 are trapped in the trap states in the charge storage insulating film 22 to store charges in the charge storage insulating film 22.

As described above, in the nonvolatile semiconductor memory according to the present embodiment, the high oxygen concentration portion 22b is formed between the low oxygen concentration portions 22a in the charge storage insulating film 22. That is, the high oxygen concentration portion 22b of the charge storage insulating film 22 is formed in the area between adjacent memory cells. The high oxygen concentration portion 22b has a lower trap state density than the low oxygen concentration portion 22a. Thus, the high oxygen concentration portion 22b can inhibit charges from migrating between the adjacent low oxygen concentration portions 22a. That is, stored charges can be inhibited from migrating between the adjacent memory cells. The present embodiment can thus prevent possible malfunctioning of the memory cells caused by the migration of the stored charges. A nonvolatile semiconductor memory is thus obtained which offers excellent operation characteristics and high reliability.

Furthermore, in the nonvolatile semiconductor memory according to the present embodiment, the charge block insulating film 23 is formed in the area between the adjacent memory cells. Here, the charge block insulating film 23 is made up of a material with a higher dielectric constant than the interlayer insulating film 26. Thus, compared to a memory structure in which the charge block insulating film is not present in the area between the adjacent memory cells, the nonvolatile semiconductor memory according to the present embodiment can improve the ability of the control gate electrode 24 to control the electric potential at the surface of the semiconductor substrate 11. As a result, the possible interference between the adjacent cells can be inhibited, thus preventing memory cell transistors from malfunctioning owing to a variation in the threshold voltages of the memory cell transistors. In particular, miniaturization of the memory cell transistors (for example, the channel length of the memory cell transistors is reduced to at most about 50 nm) increases the level of the possible interference between the adjacent cells. Thus, in this case, the above-described effects are significant.

In the present embodiment, the oxygen concentration of the low oxygen concentration portion 22a is typically at most about 1 atom %. In particular, setting the oxygen concentration to at most 0.1 atom % preferably increase the charge trap density and improves memory operating speed. Furthermore, the oxygen concentration of the high oxygen concentration portion 22b is typically about 10 to 50 atom %. Here, when the high oxygen concentration portion 22b has an excessively high oxygen concentration, the dielectric constant decreases, degrading the ability of the control gate electrode 24 to control the electric potential at the surface of the semiconductor substrate 11. In particular, when the size of a memory cell is at most about 50 nm, the degraded electric potential controllability causes the memory to malfunction. Thus, the preferable oxygen concentration is about 10 to 30 atom %. However, if the malfunctioning of the memory can be avoided, a higher oxygen concentration is preferable because this serves to more effectively inhibit the possible migration of stored charges. The silicon oxide film containing almost no nitrogen can be used. Setting the oxygen concentration as described above enables the trap state density of the high oxygen concentration portion 22b to be reduced to about one tenth to one thousandth of that of the low oxygen concentration portion 22a.

Now, a method of manufacturing a semiconductor device according to the present embodiment will be described with reference to FIGS. 2A and 2B to FIGS. 6A and 6B. FIGS. 2A to 6A are sectional views taken along the channel length direction (bit line direction). FIGS. 2B to 6B are sectional views taken along the channel width direction (word line direction).

First, as shown in FIGS. 2A and 2B, a silicon oxide film of thickness about 5 nm is formed on the semiconductor substrate (silicon substrate) 11 as the tunnel insulating film 21 by a thermal oxidation method. Subsequently, a silicon nitride film of thickness about 5 nm is formed on the tunnel insulating film as the charge storage insulating film 22 by a CVD (Chemical Vapor Deposition) method. The oxygen concentration in the silicon nitride film was analyzed by an SIMS (Secondary Ion Mass Spectroscopy) method and determined to be about 0.01 atom %. Subsequently, a lanthanum aluminate film of thickness about 30 nm is formed on the charge storage insulating film 22 as the charge block insulating film 23 by a sputtering method. A doped polycrystalline silicon film is further formed on the charge block insulating film 23 as the lower control gate electrode film 24a by the CVD method.

Then, as shown in FIGS. 3A and 3B, a silicon nitride film is formed as a mask film 31 by the CVD method. Subsequently, the mask film 31, the lower control gate electrode film 24a, the charge block insulating film 23, the charge storage insulating film 22, the tunnel insulating film 21, and the semiconductor substrate 11 are etched, by an RIE (Reactive Ion Etching) method, using a photo resist pattern (not shown in the drawings) extending in the bit line direction, as a mask. As a result, isolation trenches extending in the bit line direction are formed, with the element area (active area) 13 formed between isolation trenches. The widths of the isolation trench and the element area are both about 50 nm. A silicon oxide film is subsequently deposited all over the resulting surface as the isolation insulating film 12. The isolation insulating film 12 is subsequently flattened by a CMP (Chemical Mechanical Polishing) method. Thus, a structure is obtained in which the isolation trenches are filled with the isolation insulating film 12.

Then, as shown in FIGS. 4A and 4B, the mask film 31 is selectively removed by wet etching to expose the top surface of the lower control gate electrode film 24a. A tungsten silicide film is formed on the lower control gate electrode film 24a and the isolation insulating film 12 as the upper control gate electrode film 24b by the CVD method.

Then, as shown in FIGS. 5A and 5B, a silicon nitride film is formed on the upper control gate electrode film 24b as the mask film 25 by the CVD method. The mask film 25, the upper control gate electrode film 24b, and the lower control gate electrode film 24a are etched by the RIE method using a photo resist pattern (not shown in the drawings) extending in the word line direction as a mask. Thus, the pattern of the control gate electrodes 24 is formed. The electrode width of the control gate electrode 24 and the width of the space between the control gate electrodes 24 are both about 50 nm.

Additionally, when etching is performed by RIE using a chlorine gas, the lower control gate electrode film (doped polycrystalline silicon film) 24a can be etched substantially without etching the charge block insulating film (lanthanum aluminate film) 23.

Then, as shown in FIGS. 6A and 6B, oxygen radicals are introduced, by a plasma oxidation method, from the area between the adjacent control gate electrodes 24 through the charge block insulating film 23 into the charge storage insulating film 22. Specifically, a process target substrate with such a structure as shown in FIGS. 5A and 5B is installed in a low pressure chamber. The process target substrate is then heated to about 400 to 800° C. Then, an oxygen gas or an oxygen-containing gas is fed into the low pressure chamber. A mixed gas of an oxygen gas and an inert gas or a mixed gas of an oxygen-containing gas and an inert gas may be fed into the low pressure chamber. Moreover, the supply gas is changed to plasma by radio frequency or microwave to generate oxygen radicals in the low pressure chamber. The oxygen radicals generated are introduced into the charge storage insulating film 22. At this time, the stack structure of the control gate electrode 24 and the mask film 25 functions as a mask. Thus, almost no oxygen radical is introduced into the area under the control gate electrode 24. As a result, the part of the charge storage insulating film 22 positioned under the control gate electrode 24 becomes a low oxygen concentration portion 22a with an oxygen concentration of 0.1 atom %. The part of the charge storage insulating film 22 sandwiched between the low oxygen concentration portions 22a becomes a high oxygen concentration portion 22b with an oxygen concentration of about 20 atom %. That is, in the high oxygen concentration portion 22b, the silicon nitride film is converted into a silicon oxynitride film.

Then, an impurity element such as arsenic is ion-implanted into the surface area of the semiconductor substrate 11 using the stack structure of the control gate electrode 24 and the mask film 25 as a mask. Thermal treatment is further performed to form a source area 14 and a drain area 15 as shown in FIGS. 1A and 1B. An interlayer insulating film 26 is thereafter formed. Wiring (not shown in the drawings) and the like are further formed. Thus, such a nonvolatile semiconductor memory as shown in FIGS. 1A and 1B is obtained.

As described above, in the method of manufacturing the nonvolatile semiconductor memory according to the present embodiment, the oxygen radicals are introduced into the charge storage insulating film 22 using the control gate electrode 24 as a mask to form the high oxygen concentration portion 22b in the charge storage insulating film 22. Thus, the high oxygen concentration portion 22b can be adequately formed in the area between the adjacent memory cells and can adequately suppress the migration of charges between the adjacent memory cells. The present embodiment can therefore effectively prevent the possible malfunctioning of memory cells caused by the migration of stored charges between the adjacent memory cells.

Furthermore, forming the high oxygen concentration portion 22b in the charge storage insulating film 22 allows the possible migration of the charges between the adjacent memory cells to be prevented without the need to etch away the charge storage insulating film 22 and charge block insulating film 23 located between the adjacent memory cells. That is, if the charge storage insulating film 22 and charge block insulating film 23 located between the adjacent memory cells are etched away, the tunnel insulating film 21 and the semiconductor substrate 11 are also etched. Gouging may thus be created in the surface area of the semiconductor substrate 11. As a result, an impurity diffusion layer for a source and a drain is formed at a position lower than a substrate surface position of a channel area. Thus, a short channel effect may be exerted, reducing the threshold voltages of the memory cell transistors. In particular, if the charge storage insulating film 22 or the charge block insulating film 23 is made of a material (for example, a high dielectric constant insulating film) that is difficult to etch or the distance between the adjacent memory cells is very short, about at most 50 nm, the above-described problem becomes more serious. In the present embodiment, oxygen radicals are introduced into the charge storage insulating film 22 between the adjacent memory cells to form the high oxygen concentration portion 22b to prevent the possible migration of charges between the adjacent memory cells.

Consequently, such a problem as described above can be reliably avoided.

Furthermore, in the present embodiment, the oxygen radicals generated by plasma are used to form the high oxygen concentration portion 22b in the charge storage insulating film 22. In this case, the kinetic energy of the oxygen radicals is low, about 1 to 100 eV. The present embodiment can thus effectively avoid degrading the crystallinity of the surface area of the semiconductor substrate and the insulation characteristics of the tunnel insulating film 21. Furthermore, the kinetic energy and thermal diffusion of the oxygen radicals allow the oxygen radicals to reach the charge storage insulating film 22. Thus, the present embodiment can sufficiently control the distribution, in the depth direction, of the oxygen radicals introduced into the charge storage insulating film 22. The present embodiment can thus prevent possible oxidation of the surface area of the semiconductor substrate 11 caused by the oxygen radicals. As a result, the threshold voltages of the memory cell transistors can be effectively inhibited from varying.

Instead of the plasma oxidation method, the ion implantation method may be used to introduce oxygen into the charge storage insulating film 22. However, the use of the ion implantation method increases the energy of oxygen ions to at least 1 keV. Thus, to effectively prevent problems such as the degraded crystallinity of the surface area of the semiconductor substrate, the degraded insulation characteristics of the tunnel insulating film, and the oxidized surface area of the semiconductor substrate 11, the plasma oxidation method is desirably used to introduce the oxygen radicals into the charge storage insulating film 22. Any other method may be used provided that oxygen radicals having energy of at most about 100 eV can be introduced into the charge storage insulating film 22. For example, what is called a remote plasma method may be used which introduces oxygen radicals generated outside a reaction chamber.

Alternatively, the oxygen radicals may be oxygen atoms in a ground state or an excited state, or oxygen molecules in the excited state. However, the oxygen molecules involve a molecule dissociation process. Thus, the oxygen atoms are desirable in terms of oxidation efficiency.

In the present embodiment, heating is provided when the oxygen radicals are introduced into the charge storage insulating film 22. However, the heating may be omitted. However, if the charge block insulating film 23 has a large physical thickness, for example, if a high dielectric constant insulating film is used as the charge block insulating film 23, the oxygen radicals have difficulty reaching the charge storage insulating film 22. Thus, in this case, the heating is desirably provided. Heating temperature may be set according to a required diffusion length. When the film thickness of the charge block insulating film 23 is about 5 to 30 nm, the heating temperature may be set to about 400 to 800° C.

Furthermore, when the oxygen radicals are introduced into the charge storage insulating film 22, a bias voltage of about 10 to 100V may be applied to the semiconductor substrate. The application of the bias voltage enables an increase in the amount of oxygen introduced into the charge storage insulating film 22. Thus, the silicon nitride film can be efficiently converted into a silicon oxynitride film. This is particularly effective if the charge block insulating film 23 has a large physical thickness, for example, if a high dielectric constant insulating film is used as the charge block insulating film 23. The oxygen radicals in the oxygen plasma are normally positively charged. Thus, a negative bias voltage or an AC bias voltage is preferably applied to the semiconductor substrate. Additionally, the application of the bias voltage improves the directionality of the oxygen radicals. This enables a reduction in the amount of oxygen radicals fed to a side wall of the control gate electrode 24. Therefore, if the control gate electrode 24 contains an easily oxidizable material such as a polycrystalline silicon film, the amount of oxidation of the side wall is reduced. The dimensional controllability of the control gate electrode 24 can be improved.

Furthermore, the range of the oxygen radicals is desirably larger than the film thickness of the charge block insulating film 23 and smaller than the sum of the film thickness of the charge storage insulating film 22 and the film thickness of the charge block insulating film 23. The appropriate range can be set by adjusting the film thicknesses of the charge storage insulating film 22 and the charge block insulating film 23 or the bias voltage applied to the semiconductor substrate. However, the range need not be set as described above provided that the charge storage insulating film 22 can be appropriately oxidized by the oxygen radicals.

In the above-described embodiment, a silicon nitride film containing a small amount of oxygen is used as the charge storage insulating film 22. However, the silicon nitride film may contain another element such as carbon or hydrogen. Alternatively, an insulating film other than the silicon nitride film may be used as the charge storage insulating film 22. Specifically, an insulating film may be used which has charge trap states resulting from oxygen vacancy and which has a charge trap state density reduced by oxidation. For example, a metal oxide film containing a predetermined metal element and oxygen as main components may be used as the charge storage insulating film 22. Specifically, a high dielectric constant oxide film such as a tantalum (Ta) oxide film, a hafnium (Hf) oxide film, or a zirconium (Zr) oxide film may be used.

In the above-described embodiment, the lanthanum aluminate film is used as the charge block insulating film 23. However, an alumina film, a silicon oxide film, or the like may be used.

In the above-described embodiment, the oxygen radicals are introduced into the charge storage insulating film 22 to convert the silicon nitride film into the silicon oxynitride film. However, a sufficient amount of oxygen radicals may be introduced into the silicon nitride film so that the silicon nitride film can be substantially converted into the silicon oxide film. Furthermore, the silicon oxynitride film or the silicon oxide film may contain an element such as carbon or hydrogen.

In the above-described embodiment, the oxygen radicals are introduced into the charge storage insulating film 22 to convert the silicon nitride film into the silicon oxynitride film. Then, the source area 14 and the drain area 15 are formed by the ion implantation method. However, after the source area 14 and the drain area 15 are formed, the oxygen radicals may be introduced to convert the silicon nitride film into the silicon oxynitride film. Implanted ions are introduced into the silicon substrate 11 through the charge block insulating film 23, charge storage insulating film 22, and the tunnel insulating film 21. Thus, the high oxygen concentration portion 22b of the charge storage insulating film 22 may be physically damaged or contaminated to degrade the insulation characteristics. In this case, after the ion implantation, the oxygen radicals may be used to perform conversion into the silicon oxynitride film to allow the degradation of the insulation characteristics to be alleviated. Thus, the possible migration of stored charges toward the adjacent cells can be effectively inhibited.

Figure 8:
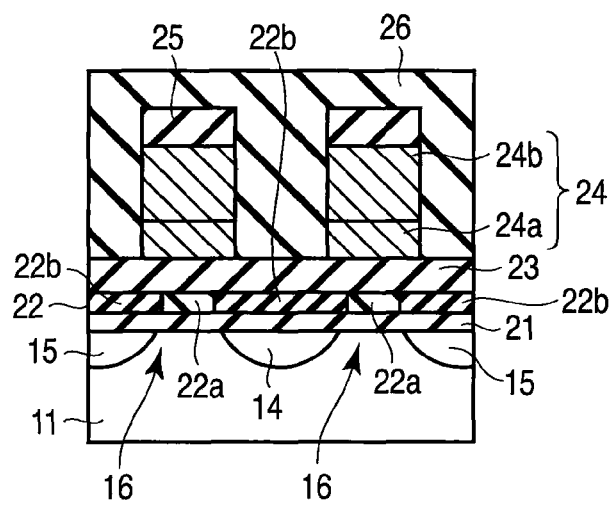
FIG. 8 is a sectional view schematically showing the configuration of a semiconductor device according to a modification of the first embodiment of the present invention.
Figure 9:
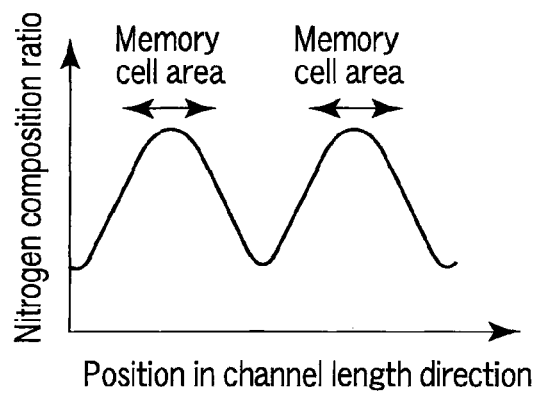
FIG. 9 is a diagram illustrating the configuration of a semiconductor device according to a modification of the first embodiment of the present invention.

In the above-described embodiment, the width of the high oxygen concentration portion 22b of the charge storage insulating film 22 is equivalent to that of the space between the adjacent control gate electrodes 24. However, the width of the high oxygen concentration portion 22b need not necessarily be equivalent to the space width. As shown in FIG. 7, the width of the high oxygen concentration portion 22b may be smaller than that of the space between the control gate electrodes 24. In this case, a sufficient amount of charges can be stored in the memory cell, thus enabling the threshold voltage window of the memory cell to be enlarged. Alternatively, as shown in FIG. 8, the width of the high oxygen concentration portion 22b may be larger than that of the space between the control gate electrodes 24. In this case, the possible migration of charges between the adjacent memory cells can be reliably inhibited, thus enabling the reliability of the memory cell to be improved. Furthermore, the low oxygen concentration portion 22a and high oxygen concentration portion 22b of the charge storage insulating film 22 need not be definitely separated from each other. For example, the nitrogen composition ratio (or oxygen composition ratio) of the charge storage insulating film 22 may vary continuously in the channel length direction. That is, effects similar to those of the above-described embodiment can be exerted by setting the nitrogen composition ratio of the charge storage insulating film 22 such that the ratio is high in the memory area and low in the inter-memory-cell area as shown in FIG. 9.

Figure 10:
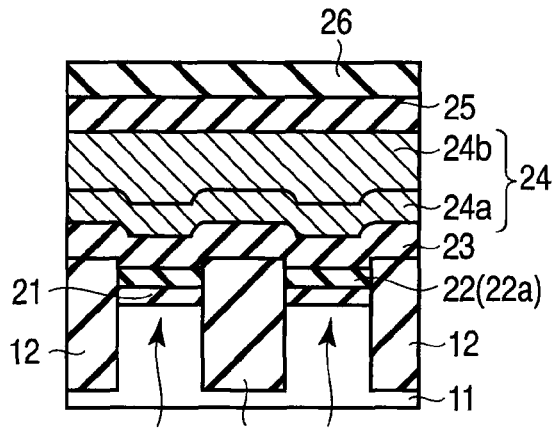
FIG. 10 is a sectional view schematically showing the configuration of a semiconductor device according to a modification of the first embodiment of the present invention.

In the above-described embodiment, the charge block insulating film 23 is separated by the isolation area 12 as shown in FIG. 1B. However, provided that the charge storage insulating film 22 is separated by the isolation area 12 as shown in FIG. 10, the charge block insulating film 23 need not be separated. Even this structure can exert effects similar to those of the above-described embodiment. However, the cell structure in FIG. 1B is desirable in that the cell structure allows the possible migration of charges through the charge block insulating film 23 to be avoided.

Figure 11:
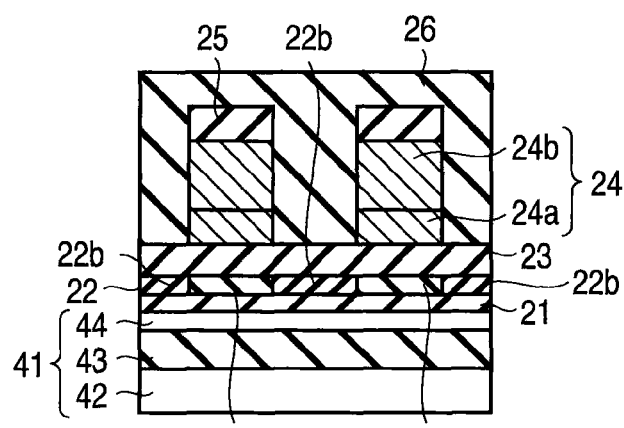
FIG. 11 is a sectional view schematically showing the configuration of a semiconductor device according to a modification of the first embodiment of the present invention.

In the above-described embodiment, the normal silicon substrate is used as the semiconductor substrate 11. However, an SOI substrate may be used. FIG. 11 is a sectional view schematically showing a configuration in which an SOI substrate is used as a semiconductor substrate. The SOI substrate (semiconductor substrate) 41 is composed of a silicon substrate 42, an insulating layer 43, and a silicon layer 44. A structure similar to that shown in FIGS. 1A and 1B is formed on the silicon layer 44.

The memory cell transistor shown in FIG. 11 is of a depletion type and includes no impurity diffusion layer for a source and a drain in the silicon layer 44. This eliminates the need to ion-implant an impurity element for the source and drain. To form the impurity diffusion layer for the source and drain, the impurity element needs to be ion-implanted into the silicon layer 44 through the charge block insulating film 23, the charge storage insulating film 22, and the tunnel insulating film 21. This may physically damage and contaminate these insulating films, degrading the insulation characteristics of the insulating films. The degraded insulation characteristics may facilitate the migration of stored charges toward the adjacent cells. The depletion-type memory cell transistor shown in FIG. 11 eliminates the need to form the impurity diffusion layer for the source and drain. This in turn prevents such charge migration as described above from being facilitated. Thus, the effects of the present embodiment can be sufficiently exerted, enabling the reliability of the memory to be improved.

Figure 12:
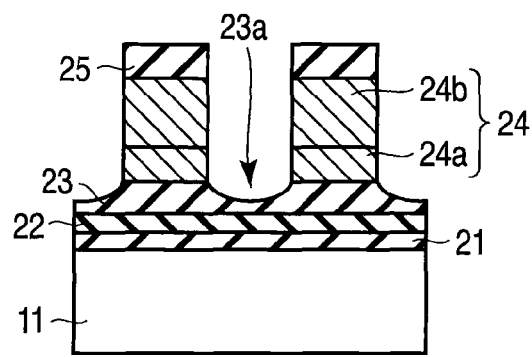
FIG. 12 is a sectional view schematically showing a part of a process of manufacturing a semiconductor device according to a modification of the first embodiment of the present invention.

In the above-described manufacturing method, after the steps shown in FIGS. 5A and 5B, a recess may be formed in the surface area of the charge block insulating film 23. FIGS. 12 and 13 are sectional views schematically showing a part of a manufacturing process for forming a recess in the surface area of the charge block insulating film 23. That is, after the steps shown in FIGS. 5A and 5B, as shown in FIG. 12, the exposed surface of the charge block insulating film 23 is selectively etched to form a recess 23a in the charge block insulating film 23. Thereafter, as shown in FIG. 13, oxygen radicals are introduced into the charge storage insulating film 22 to form a high oxygen concentration portion 22b in the charge storage insulating film 22 as is the case with the steps shown in FIGS. 6A and 6B.

Forming the recess 23a in the charge block insulating film 23 as described above enables a reduction in the range of the oxygen radicals. As a result, the distribution of the oxygen radicals in the depth direction can be easily controlled. A sufficient amount of oxygen radicals can thus be easily introduced into the charge storage insulating film 22. Furthermore, a bias voltage applied to the semiconductor substrate can be reduced. This enables a reduction in possible physical damage to the charge block insulating film 23, the charge storage insulating film 22, the tunnel insulating film 21, and the semiconductor substrate 11. Thus, the crystallinity of the semiconductor substrate and the insulation characteristics of the insulating films can be effectively prevented from being degraded.

Of course, the above-described modifications may be appropriately combined together.

Embodiment 2

Now, a second embodiment of the present invention will be described. The basic configuration and manufacturing method of the second embodiment are similar to those of the first embodiment. The various modifications described in the first embodiment are similarly applicable to the present embodiment. Thus, the matters described in the first embodiment and matters that can be easily envisaged from the first embodiment will not be described.

FIGS. 14A and 14B are sectional views schematically showing the configuration of a semiconductor device according to the present embodiment. FIG. 14A is a sectional view taken along the channel length direction (bit line direction). FIG. 14B is a sectional view taken along the channel width direction (word line direction).

In the present embodiment, a charge storage insulating film 22 includes at least two separated low fluorine concentration portions 22c and a high fluorine concentration portion 22d positioned between the adjacent low fluorine concentration portions 22c. The high fluorine concentration portion 22d has a higher fluorine concentration than the low fluorine concentration portion 22c. In the present embodiment, the low fluorine concentration portion 22c contains silicon and nitrogen as main components. The high fluorine concentration portion 22d contains silicon, nitrogen, and fluorine as main components. Specifically, the low fluorine concentration portion 22c is a silicon nitride film containing almost no fluorine. The high fluorine concentration portion 22d is a silicon nitride film containing a high concentration of fluorine. The fluorine contained in the charge storage insulating film 22 terminates dangling bonds as the charge trap states. Thus, the high fluorine concentration portion 22d has a lower trap state density than the low fluorine concentration portion 22c.

Thus, in the nonvolatile semiconductor memory according to the present embodiment, the high fluorine concentration portion 22d is formed between the low fluorine concentration portions 22c of the charge storage insulating film 22. That is, the high fluorine concentration portion 22d, having a low trap state density, is formed in the area between adjacent memory cells. Thus, like the first embodiment, the second embodiment allows the high fluorine concentration portion 22d to inhibit the possible migration of stored charges between the adjacent memory cells. This allows the possible malfunctioning of the memory cells caused by the migration of the stored charges to be prevented. Therefore, a nonvolatile semiconductor memory with excellent operation characteristics and high reliability can be provided.

The above-described effects can be produced using hydrogen in place of the fluorine. However, the fluorine is desirable because the termination with the fluorine results in firm bonds that are difficult to break, leading to improved reliability. Alternatively, the above-described effects can be produced using chlorine, bromine, or iodine in place of the fluorine. However, the fluorine is desirable because a large amount of chlorine, bromine, or iodine contained in the insulating film is likely to degrade the insulation characteristics.

As in the case of the first embodiment, in the nonvolatile semiconductor memory according to the present embodiment, a charge block insulating film 23 is also formed in the area between the adjacent memory cells. Thus, like the first embodiment, the present embodiment can improve the ability of a control gate electrode 24 to control the electric potential at the surface of a semiconductor substrate 11. As a result, the possible interference between the adjacent cells can be inhibited. The present embodiment can thus prevent the possible malfunctioning of memory cell transistors caused by variation in the threshold voltages of the transistors.

In the present embodiment, the fluorine concentration of the low fluorine concentration portion 22c is typically at most about 0.1 atom %. The fluorine concentration of the high fluorine concentration portion 22d is typically about 1 to 10 atom %. When the fluorine concentration of the high fluorine concentration portion 22d exceeds 10 atom %, the possible degradation of the insulation characteristics caused by a decrease in film density and the possible malfunctioning of the memory caused by a decrease in dielectric constant are nonnegligible. Thus, the fluorine concentration preferably does not exceed about 10 atom %.

The basic method of manufacturing the semiconductor device according to the present embodiment is similar to the process shown in FIGS. 2A and 2B to FIGS. 6A and 6B for the first embodiment. In the present embodiment, in the steps shown in FIGS. 6A and 6B, instead of the oxygen radicals, fluorine radicals are introduced into the charge storage insulating film 22. That is, the fluorine radicals are introduced from the area between the control gate electrodes 24 through the charge block insulating film 23 into the charge storage insulating film 22. A basic method of introducing the fluorine radicals is similar to the method of introducing the oxygen radicals described in the first embodiment. Specifically, a process target substrate with such a structure as shown in FIGS. 5A and 5B is installed in a low pressure chamber. A fluorine gas or a fluorine-containing gas (for example, nitrogen trifluoride) is fed into the low pressure chamber. A mixed gas of a fluorine gas and an inert gas or a mixed gas of a fluorine-containing gas and an inert gas may be fed into the low pressure chamber. Moreover, the supply gas is changed to plasma by radio frequency or microwave to generate fluorine radicals in the low pressure chamber. The fluorine radicals generated are introduced into the charge storage insulating film 22. At this time, the stack structure of the control gate electrode 24 and a mask film 25 functions as a mask. Thus, almost no fluorine radical is introduced into the area under the control gate electrode 24. As a result, as shown in FIGS. 14A and 14B, a part of the charge storage insulating film 22 positioned under the control gate electrode 24 becomes the low fluorine concentration portion 22c. A part of the charge storage insulating film 22 sandwiched between the adjacent low fluorine concentration portions 22c becomes the high fluorine concentration portion 22d.

As described above, in the method of manufacturing the nonvolatile semiconductor memory according to the present embodiment, the fluorine radicals are introduced into the charge storage insulating film 22 using the control gate electrode 24 as a mask to form the high fluorine concentration portion 22d in the charge storage insulating film 22. Thus, the high fluorine concentration portion 22d can be adequately formed in the area between the adjacent memory cells and can adequately suppress the migration of charges between the adjacent memory cells. Therefore, like the first embodiment, the present embodiment can effectively prevent the possible malfunctioning of memory cells caused by the migration of stored charges between the adjacent memory cells.

Furthermore, forming the high fluorine concentration portion 22d in the charge storage insulating film 22 allows the possible migration of the charges between the adjacent memory cells to be prevented without the need to etch away the charge storage insulating film 22 and charge block insulating film 23 located between the adjacent memory cells. Thus, like the first embodiment, the present embodiment can reliably prevent the surface area of the semiconductor substrate 11 from being disadvantageously etched to form gouging.

In the present embodiment, the fluorine radicals generated by plasma are used to form the high fluorine concentration portion 22d in the charge storage insulating film 22. The kinetic energy of the fluorine radicals is low, about 1 to 100 eV. Thus, like the first embodiment, the present embodiment can effectively avoid degrading the crystallinity of the surface area of the semiconductor substrate and the insulation characteristics of a tunnel insulating film 21.

In the present embodiment, instead of the oxygen radicals, the fluorine radicals are introduced into the charge storage insulating film 22. This advantageously prevents the surface area of the semiconductor substrate 11 from being oxidized. Thus, a large amount of fluorine radicals can be introduced up to the vicinity of the surface of the semiconductor substrate 11. The charge trap state density of the charge storage insulating film 22d in the area between adjacent memory cells can thus be effectively reduced.

In the above-described embodiment, the silicon nitride film is used as the charge storage insulating film 22. However, any other insulating film may be used. Specifically, an insulating film may be used which uses dangling bonds as charge trap states and which has a charge trap state density reduced by introducing fluorine radicals. For example, a metal oxide film containing a predetermined metal element and oxygen as main components may be used as the charge storage insulating film 22. Specifically, a high dielectric constant oxide film such as a tantalum (Ta) oxide film, a hafnium (Hf) oxide film, or a zirconium (Zr) oxide film may be used.

In the above-described manufacturing method, after the fluorine radicals are introduced into the charge storage insulating film 22, high-temperature annealing may be performed at a temperature of at least 800° C.

The high-temperature annealing allows the dangling bonds to be easily terminated, thus enabling a reliable reduction in charge trap state density.

Embodiment 3

Now, a third embodiment of the present invention will be described. The basic configuration and manufacturing method of the third embodiment are similar to those of the first embodiment. The various modifications described in the first embodiment are similarly applicable to the present embodiment. Thus, the matters described in the first embodiment and matters that can be easily envisaged from the first embodiment will not be described.

FIGS. 15A and 15B are sectional views schematically showing the configuration of a semiconductor device according to the present embodiment. FIG. 15A is a sectional view taken along the channel length direction (bit line direction). FIG. 15B is a sectional view taken along the channel width direction (word line direction).

In the present embodiment, a charge storage insulating film 22 includes at least two separated low oxygen concentration portions 22e and a high oxygen concentration portion 22f positioned between the adjacent low oxygen concentration portions 22e. The high oxygen concentration portion 22f has a higher oxygen concentration than the low oxygen concentration portion 22e. The high oxygen concentration portion 22f also has a higher boron concentration than the low oxygen concentration portion 22e. Specifically, the low oxygen concentration portion 22e is a silicon nitride film containing almost no oxygen and boron (B). The high oxygen concentration portion 22f is a silicon oxynitride film containing a high concentration of boron. The high oxygen concentration portion 22f has a lower trap state density than the low oxygen concentration portion 22e.

Thus, in the nonvolatile semiconductor memory according to the present embodiment, the high oxygen concentration portion 22f is formed between the low oxygen concentration portions 22e of the charge storage insulating film 22. That is, the high oxygen concentration portion 22f, having a low trap state density, is formed in the area between adjacent memory cells. Thus, like the first embodiment, the third embodiment allows the high oxygen concentration portion 22f to inhibit the possible migration of stored charges between the adjacent memory cells. This allows the possible malfunctioning of the memory cells caused by the migration of the stored charges to be prevented. Therefore, a nonvolatile semiconductor memory with excellent operation characteristics and high reliability can be provided.

As in the case of the first embodiment, in the nonvolatile semiconductor memory according to the present embodiment, a charge block insulating film 23 is also formed in the area between the adjacent memory cells. Thus, like the first embodiment, the present embodiment can improve the ability of a control gate electrode 24 to control the electric potential of the surface of a semiconductor substrate 11. As a result, the possible interference between the adjacent cells can be inhibited. The present embodiment can thus prevent the possible malfunctioning of memory cell transistors caused by variation in the threshold voltages of the transistors.

The basic method of manufacturing the semiconductor device according to the present embodiment is similar to the process shown in FIGS. 2A and 2B to FIGS. 6A and 6B for the first embodiment. In the present embodiment, in the steps shown in FIGS. 6A and 6B, boron is introduced into the charge storage insulating film 22 before the oxygen radicals are introduced into the charge storage insulating film 22. Specifically, first, boron is introduced from the area between the control gate electrodes 24 through the charge block insulating film 23 into the charge storage insulating film 22. The boron may be introduced into the charge storage insulating film 22 by a boron plasma method, an ion implantation method, a vapor phase diffusion method, a solid phase diffusion method, or the like. After the introduction of the boron, the oxygen radicals are introduced from the area between the control gate electrodes 24 through the charge block insulating film 23 into the charge storage insulating film 22. A basic method of introducing the oxygen radicals is similar to the method of introducing the oxygen radicals described in the first embodiment.

Pre-introducing the boron into the charge storage insulating film 22 allows improvement of the efficiency with which the oxygen radicals oxidize the charge storage insulating film 22, that is, the efficiency with which the silicon nitride film is converted into a silicon oxynitride film. When the boron introduced into the charge storage insulating film 22 has a concentration of at least about 0.1 atom %, the oxidation efficiency (the efficiency with which the silicon nitride film is converted into a silicon oxynitride film) can be reliably improved by the introduction of the boron. When the boron concentration is at least about 1 atom %, the oxidation efficiency can be significantly improved by the introduction of the boron. However, when the boron introduced into the charge storage insulating film 22 has a concentration of at least about 30 atom %, the film quality of the charge storage insulating film 22 is degraded. Thus, the boron concentration is preferably at most 30 atom %.

As described above, in the method of manufacturing the nonvolatile semiconductor memory according to the present embodiment, the boron and the oxygen radicals are introduced into the charge storage insulating film 22 using the control gate electrode 24 as a mask to form the high oxygen concentration portion 22$f$ in the charge storage insulating film 22. Thus, the high oxygen concentration portion 22$f$ can be adequately formed in the area between the adjacent memory cells and can adequately suppress the migration of charges between the adjacent memory cells. Therefore, like the first embodiment, the present embodiment can effectively inhibit the possible migration of stored charges between the adjacent memory cells. This enables the possible malfunctioning of the memory cells to be effectively prevented.

Furthermore, forming the high oxygen concentration portion 22$f$ in the charge storage insulating film 22 allows the possible migration of the charges between the adjacent memory cells to be prevented without the need to etch away the charge storage insulating film 22 and charge block insulating film 23 located between the adjacent memory cells. Thus, like the first embodiment, the present embodiment can reliably prevent the surface area of the semiconductor substrate 11 from being disadvantageously etched to form gouging.

Furthermore, the boron is pre-introduced into the charge storage insulating film 22, thus allowing improvement of the efficiency with which the oxygen radicals oxidize the charge storage insulating film 22. Consequently, the charge trap state density of the charge storage insulating film 22 can be more reliably reduced. As a result, the possible migration of the stored charges between the adjacent memory cells can be more reliably inhibited.

In the present embodiment, the boron, which improves the oxidation efficiency, is pre-introduced into the charge storage insulating film 22. Thus, oxygen may be introduced into the charge storage insulating film 22 by a method other than the plasma oxidation. For example, the ion implantation method may be used to introduce the oxygen into the charge storage insulating film 22. Alternatively, an oxidizing agent such as water vapor may be introduced into the charge storage insulating film 22 for thermal oxidation. Even with these oxidation methods, the oxidation efficiency improving effect of the boron allows the area between the adjacent memory cells to be selectively oxidized. Thus, the above-described memory cell structure can be easily implemented.

In the above-described embodiment, the boron is selectively introduced into the charge storage insulating film located in the area between the adjacent memory cells, and the oxidizing agent is further selectively introduced into the charge storage insulating film. However, the present embodiment is not limited to this aspect. For example, while the charge storage insulating film is being formed all over the surface of the tunnel insulating film, the boron may simultaneously be contained in the charge storage insulating film. Alternatively, after the charge storage insulating film is formed all over the surface of the tunnel insulating film, the boron may be introduced into the entire charge storage insulating film. After the pattern of the control gate electrodes is formed, the oxygen radicals are selectively introduced into the area between the adjacent memory cells. Thus, the oxidation efficiency improving effect of the boron allows the high oxygen concentration portion 22$f$ to be easily formed.

Embodiment 4

A fourth embodiment of the present invention will be described. The basic configuration and manufacturing method of the fourth embodiment are similar to those of the first embodiment. The various modifications described in the first embodiment are similarly applicable to the present embodiment. Thus, the matters described in the first embodiment and matters that can be easily envisaged from the first embodiment will not be described.

FIGS. 16A and 16B are sectional views schematically showing the configuration of a semiconductor device according to the present embodiment. FIG. 16A is a sectional view taken along the channel length direction (bit line direction). FIG. 16B is a sectional view taken along the channel width direction (word line direction).

An element area (active area) 13 sandwiched between isolation areas (isolation insulating films) 12 is provided in a semiconductor substrate (silicon substrate) 11. The element area 13 has a source area 14, a drain area 15, and a channel area 16 between the source area 14 and the drain area 15.

A tunnel insulating film 21 is formed on the element area 13. The tunnel insulating film 21 has what is called an ONO structure composed of a lower silicon oxide film (lower insulating film) 211, an intermediate silicon nitride film (intermediate insulating film) 212, and an upper silicon oxide film (upper insulating film) 213. The tunnel insulating film of the ONO structure is known to be effective for increasing the erase speed of charge trap type nonvolatile memory cells. The intermediate silicon nitride film 212 includes at least two separated low oxygen concentration portions 212$a$ and a high oxygen concentration portion 212$b$ positioned between the adjacent low oxygen concentration portions 212$a$. The high oxygen concentration portion 212b has a higher oxygen concentration than the low oxygen concentration portion 212a. In the present embodiment, the low oxygen concentration portion 212a contains silicon and nitrogen as main components. The high oxygen concentration portion 212b contains silicon, nitrogen, and oxygen as main components. Specifically, the low oxygen concentration portion 212a is a silicon nitride film containing a small amount of oxygen. The high oxygen concentration portion 212b is a silicon oxynitride film containing a large amount of oxygen.

Thus, the high oxygen concentration portion 212b has a lower trap state density than the low oxygen concentration portion 212a.

A charge storage insulating film 22 made up of a hafnium oxide film is formed on the tunnel insulating film 21 and above the low oxygen concentration portion 212a of the silicon nitride film 212. A charge block insulating film 23 made up of an alumina film is formed on the charge storage insulating film 22. A control gate electrode 24 is formed on the charge block insulating film 23. That is, the control gate electrode 24 is formed above the low oxygen concentration portion 212a of the silicon nitride film 212. The control gate electrode 24 serves as a word line. The control gate electrode 24 is composed of a lower control gate electrode film formed of a doped polycrystalline silicon film and an upper control gate electrode film formed of a tungsten silicide film. A mask film 25 is formed on the control gate electrode 24. The above-described tunnel insulating film 21, charge storage insulating film 22, charge block insulating film 23, control gate electrode 24, and mask film 25 are covered with an interlayer insulating film 26.

As described above, in the nonvolatile semiconductor memory according to the present embodiment, the high oxygen concentration portion 212b is formed between the low oxygen concentration portions 212a of the intermediate silicon nitride film 212 of the tunnel insulating film 21. That is, the high oxygen concentration portion 212b of the intermediate silicon nitride film 212 is formed in the area between the adjacent memory cells. The high oxygen concentration portion 212b has a lower trap state density than the low oxygen concentration portion 212a. Thus, even if charges are trapped in the low oxygen concentration portion 212a of the intermediate silicon nitride film 212 during a write or erase operation on the memory cells, the high oxygen concentration portion 212b can inhibit charges from migrating between the adjacent low oxygen concentration portions 212a. That is, the charges can be inhibited from migrating between the adjacent memory cells. As a result, the possible malfunctioning of the memory cells caused by the migration of the charges can be prevented. A nonvolatile semiconductor memory with excellent operation characteristics and high reliability can thus be provided.

The low oxygen concentration portion 212a typically has an oxygen concentration of at most about 10 atom %. This is sufficiently effective for increasing the erase speed of the memory cells. Furthermore, the high oxygen concentration portion 212b typically has an oxygen concentration of about 10 to 50 atom %. The oxygen concentration of the high oxygen concentration portion 212b is preferably set to a larger value because the higher oxygen concentration is significantly effective for inhibiting the possible migration of trapped charges. Furthermore, the high oxygen concentration portion 212b is desirably a silicon oxide film containing almost no nitrogen.

A basic method of manufacturing a semiconductor device according to the present embodiment can be easily envisaged from the steps shown in FIGS. 2A and 2B to FIGS. 6A and 6B for the first embodiment. That is, the pattern of the control gate electrode 24, the charge block insulating film 23, and the charge storage insulating film 22 is formed. Then, oxygen radicals are introduced from the area between the control gate electrodes 24 through the upper silicon oxide film 213 into the intermediate silicon nitride film 212. A basic method of introducing the oxygen radicals is similar to that in the first embodiment. As a result, as shown in FIGS. 16A and 16B, a part of the intermediate silicon nitride film 212 positioned under the control gate electrode 24 becomes the low oxygen concentration portion 212a. A part of the intermediate silicon nitride film 212 sandwiched between the adjacent low oxygen concentration portions 212a becomes the high oxygen concentration portion 212b.

As described above, in the method of manufacturing the nonvolatile semiconductor memory according to the present embodiment, the oxygen radicals are introduced into the intermediate silicon nitride film 212 of the tunnel insulating film 21 using the control gate electrode 24 as a mask to form the high oxygen concentration portion 212b in the intermediate silicon nitride film 212. Thus, the high oxygen concentration portion 212b can be adequately formed in the area between the adjacent memory cells and can adequately suppress the migration of charges between the adjacent memory cells. Therefore, the present embodiment can effectively inhibit the possible migration of the charges between the adjacent memory cells. This enables the possible malfunctioning of the memory cells to be effectively prevented.

Furthermore, forming the high oxygen concentration portion 212b in the intermediate silicon nitride film 212 allows the possible migration of the charges between the adjacent memory cells to be prevented without the need to etch away the tunnel insulating film 21 located between the adjacent memory cells. Thus, like the first embodiment, the present embodiment can reliably prevent the surface area of the semiconductor substrate 11 from being disadvantageously etched to form gouging.

In the present embodiment, the oxygen radicals generated by plasma are used to form the high oxygen concentration portion 212b in the intermediate silicon nitride film 212 of the tunnel insulating film 21. Thus, like the first embodiment, the present embodiment can effectively avoid, for example, degrading the crystallinity of the surface area of the semiconductor substrate 11.

The present embodiment may be combined with the first embodiment. That is, in the steps shown in FIGS. 6A and 6B, using the stack structure of the control gate electrode 24 and the mask film 25 as a mask, the oxygen radicals are introduced from the area between the control gate electrodes 24 through the charge block insulating film 23 into the charge storage insulating film 22, and the oxygen radicals are introduced from the area between the adjacent control gate electrodes 24 through the charge block insulating film 23 and the charge storage insulating film 22 into the intermediate silicon nitride film 212 of the tunnel insulating film 21. Thus, the low oxygen concentration portions 22a and the high oxygen concentration portion 22b are formed in the charge storage insulating film 22 as is the case with the first embodiment. Furthermore, the low oxygen concentration portions 212a and the high oxygen concentration portion 212b are formed in the intermediate silicon nitride film 212 of the tunnel insulating film 21 as is the case with the fourth embodiment.

In the above-described embodiment, the silicon oxide film, the silicon nitride film, and the silicon oxide film are used as the lower insulating film 211, intermediate insulating film 212, and upper insulating film 213 of the tunnel insulating film 21, respectively. However, any other insulating films may be used. In general, insulating films with a low charge trap state density may be used as the lower and upper insulating films 211 and 213. An insulating film with a higher charge trap state density than the lower and upper insulating films 211 and 213 may be used as the intermediate insulating film 212. More specifically, the intermediate insulating film 212 may be an insulating film which has a charge trap state resulting from oxygen vacancy and which has the charge trap state density reduced by oxidation.

In the present embodiment, at least the high oxygen concentration portion of the tunnel insulating film may contain boron. In this case, a method similar to a method described in the third embodiment can be used to introduce boron into a portion for forming the high oxygen concentration portion.

Embodiment 5

Now, a fifth embodiment of the present invention will be described. The basic configuration and manufacturing method of the fifth embodiment are mostly similar to those of the fourth embodiment. The basic matters described in the first and second embodiments are also applicable to the present embodiment. The various modifications described in the first embodiment are similarly applicable to the present embodiment. Thus, the matters described above in the embodiments and matters that can be easily envisaged from the embodiments will not be described.

FIGS. 17A and 17B are sectional views schematically showing the configuration of a semiconductor device according to the present embodiment. FIG. 17A is a sectional view taken along the channel length direction (bit line direction). FIG. 17B is a sectional view taken along the channel width direction (word line direction).

In the present embodiment, as is the case with the fourth embodiment, a tunnel insulating film 21 has what is called an ONO structure composed of a lower silicon oxide film (lower insulating film) 211, an intermediate silicon nitride film (intermediate insulating film) 212, and an upper silicon oxide film (upper insulating film) 213. The intermediate silicon nitride film 212 includes at least two separated low fluorine concentration portions 212c and a high fluorine concentration portion 212d positioned between the adjacent low fluorine concentration portions 212c. The high fluorine concentration portion 212d has a higher fluorine concentration than the low fluorine concentration portion 212c. In the present embodiment, the low fluorine concentration portion 212c contains silicon and nitrogen as main components. The high fluorine concentration portion 212d contains silicon, nitrogen, and fluorine as main components. Specifically, the low fluorine concentration portion 212c is a silicon nitride film containing almost no fluorine. The high fluorine concentration portion 212d is a silicon nitride film containing a high concentration of fluorine. The fluorine contained in the intermediate silicon nitride film 212 of the tunnel insulating film 21 terminates dangling bonds as the charge trap states. Thus, the high fluorine concentration portion 212d has a lower trap state density than the low fluorine concentration portion 212c.

Thus, in the nonvolatile semiconductor memory according to the present embodiment, the high fluorine concentration portion 212d is formed between the low fluorine concentration portions 212c of the intermediate silicon nitride film 212. That is, the high fluorine concentration portion 212d of the intermediate silicon nitride film 212 is formed in the area between adjacent memory cells. The high fluorine concentration portion 212d has a lower trap state density than the low fluorine concentration portion 212c. Thus, even if charges are trapped in the low fluorine concentration portion 212c of the intermediate silicon nitride film 212 during a write or erase operation on the memory cells, the high fluorine concentration portion 212d can inhibit charges from migrating between the adjacent low fluorine concentration portions 212c. That is, the charges can be inhibited from migrating between the adjacent memory cells. As a result, the possible malfunctioning of the memory cells caused by the migration of the charges can be prevented. A nonvolatile semiconductor memory with excellent operation characteristics and high reliability can thus be provided.

The low fluorine concentration portion 212c typically has a fluorine concentration of at most about 0.1 atom %. The high fluorine concentration portion 212d typically has a fluorine concentration of about 1 to 10 atom %. When the fluorine concentration of the high fluorine concentration portion 212d exceeds 10 atom %, degraded insulation characteristics caused by a decrease in film density are nonnegligible. Consequently, the fluorine concentration preferably does not exceed 10 atom %.

A basic method of manufacturing a semiconductor device according to the present embodiment can be easily envisaged from the steps shown in FIGS. 2A and 2B to FIGS. 6A and 6B for the first embodiment. That is, the pattern of the control gate electrode 24, the charge block insulating film 23, and the charge storage insulating film 22 is formed. Then, fluorine radicals are introduced from the area between the control gate electrodes 24 through the upper silicon oxide film 213 into the intermediate silicon nitride film 212. A basic method of introducing the fluorine radicals is similar to that in the second embodiment. As a result, as shown in FIGS. 17A and 17B, a part of the intermediate silicon nitride film 212 positioned under the control gate electrode 24 becomes the low fluorine concentration portion 212c. A part of the intermediate silicon nitride film 212 sandwiched between the adjacent low fluorine concentration portions 212c becomes the high fluorine concentration portion 212d.

As described above, in the method of manufacturing the nonvolatile semiconductor memory according to the present embodiment, the fluorine radicals are introduced into the intermediate silicon nitride film 212 of the tunnel insulating film 21 using the control gate electrode 24 as a mask to form the high fluorine concentration portion 212d in the intermediate silicon nitride film 212. Thus, the high fluorine concentration portion 212d can be adequately formed in the area between the adjacent memory cells and can adequately suppress the migration of charges between the adjacent memory cells. Therefore, the present embodiment can effectively inhibit the possible migration of the charges between the adjacent memory cells. This enables the possible malfunctioning of the memory cells to be effectively prevented.

Furthermore, forming the high fluorine concentration portion 212d in the intermediate silicon nitride film 212 of the tunnel insulating film 21 allows the possible migration of the charges between the adjacent memory cells to be prevented without the need to etch away the tunnel insulating film 21 located between the adjacent memory cells. Thus, like the first embodiment, the present embodiment can reliably prevent the surface area of the semiconductor substrate 11 from being disadvantageously etched to form gouging.

In the present embodiment, the fluorine radicals generated by plasma are used to form the high fluorine concentration portion 212d in the intermediate silicon nitride film 212 of the tunnel insulating film 21. Thus, like the first embodiment, the present embodiment can effectively avoid, for example, degrading the crystallinity of the surface area of the semiconductor substrate 11.

The present embodiment may be combined with the second embodiment. That is, after the steps shown in FIGS. 5A and 5B, using the stack structure of the control gate electrode 24 and the mask film 25 as a mask, the fluorine radicals are introduced from the area between the control gate electrodes 24 through the charge block insulating film 23 into the charge storage insulating film 22, and the fluorine radicals are introduced from the area between the adjacent control gate electrodes 24 through the charge block insulating film 23 and the charge storage insulating film 22 into the intermediate silicon nitride film 212 of the tunnel insulating film 21. Thus, the low fluorine concentration portions 22c and the high fluorine concentration portion 22d are formed in the charge storage insulating film 22 as is the case with the second embodiment. Furthermore, the low fluorine concentration portions 212c and the high fluorine concentration portion 212d are formed in the intermediate silicon nitride film 212 of the tunnel insulating film 21 as is the case with the fifth embodiment.

In the above-described embodiment, the silicon oxide film, the silicon nitride film, and the silicon oxide film are used as the lower insulating film 211, intermediate insulating film 212, and upper insulating film 213 of the tunnel insulating film 21, respectively. However, any other insulating films may be used. In general, insulating films with a low charge trap state density may be used as the lower and upper insulating films 211 and 213. An insulating film with a higher charge trap state density than the lower and upper insulating films 211 and 213 may be used as the intermediate insulating film 212. More specifically, the intermediate insulating film 212 may be an insulating film which has a charge trap state resulting from dangling bonds and which has the charge trap state density reduced by the introduction of the fluorine.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a tunnel insulating film formed on a semiconductor substrate;
   a charge storage insulating film formed on the tunnel insulating film and including at least two separated low oxygen concentration portions and a high oxygen concentration portion positioned between the adjacent low oxygen concentration portions and having a higher oxygen concentration than the low oxygen concentration portions, the low oxygen concentration portions and the high oxygen concentration portion being in contact with the tunnel insulating film;
   a charge block insulating film formed on the charge storage insulating film; and
   control gate electrodes formed directly on the charge block insulating film and above the low oxygen concentration portions,
   wherein the charge storage insulating film includes the low oxygen concentration portions and no high oxygen concentration portion under the control gate electrodes, in a cross section parallel to a channel width direction.

2. The semiconductor device according to claim 1, wherein each of the low oxygen concentration portions contains silicon and nitrogen as main components, and the high oxygen concentration portion contains silicon, nitrogen, and oxygen as main components.

3. The semiconductor device according to claim 1, wherein the charge storage insulating film contains a predetermined metal element and oxygen as main components.

4. The semiconductor device according to claim 1, wherein the high oxygen concentration portion has a lower trap state density than the low oxygen concentration portions.

5. The semiconductor device according to claim 1, wherein at least the high oxygen concentration portion of the charge storage insulating film contains boron.

* * * * *